United States Patent [19]

Köppl et al.

[11] 4,065,533
[45] Dec. 27, 1977

[54] PROCESS FOR THE CONTINUOUS PRODUCTION OF SILICON RODS OR TUBES BY GASEOUS DEPOSITION INTO A FLEXIBLE WOUND BAND

[75] Inventors: Franz Köppl, Altotting; Rudolf Griesshammer; Helmut Hamster, both of Burghausen, all of Germany

[73] Assignee: Wacker-Chemitronic Gesellschaft fur Elektronik Grundstoffe mbH, Burghausen, Germany

[21] Appl. No.: 776,025

[22] Filed: Mar. 9, 1977

[30] Foreign Application Priority Data

Apr. 27, 1976 Germany .............................. 2618398

[51] Int. Cl.² .......................... B01J 8/00; C01B 33/02
[52] U.S. Cl. ..................................... 264/81; 425/176; 425/62; 264/166; 264/221; 156/612
[58] Field of Search ................... 264/81, 221, 166; 425/175, 176; 423/349, 350; 427/237; 156/612, 613

[56] References Cited

U.S. PATENT DOCUMENTS 3,793,938   2/1974   Haas ..................................... 425/403
3,899,557   8/1975   Dietze .................................. 264/81

Primary Examiner—James R. Hoffman
Assistant Examiner—S. Silverberg
Attorney, Agent, or Firm—Allison C. Collard

[57] ABSTRACT

A process for the continuous production of silicon rods or tubes by the deposition of silicon from the gaseous phase on the inner wall of a carrier tube heated to the deposition temperature, in which a cooled, hollow metal cylinder is placed in a reactor having one open end, and a flexible band, substantially resistant to silicon at the deposition temperature, is continuously wound onto the cylinder in an overlapping manner at an angle of pitch from 5° to 40° so as to form the carrier tube for the silicon to be deposited; the tube is continuously drawn off the metal cylinder by a rotary traction movement and the portion of the tube adjacent the metal cylinder and still in the reactor is heated to the deposition temperature of about 1050° to 1250° C, while at the same time the gaseous mixture is passed for decomposition through the tube under a pressure exceeding the external atmospheric pressure by 0.01 - 1 bar, thus causing the inside of the tube gradually to be filled partly or entirely with the silicon as the decomposition of the gas mixture proceeds, and finally the Si-filled tube is continuously withdrawn from the reactor at the open end thereof, with the recovery of the silicon rod or tube by removal of the carrier tube through etching, burning off, or sandblasting.

9 Claims, 1 Drawing Figure

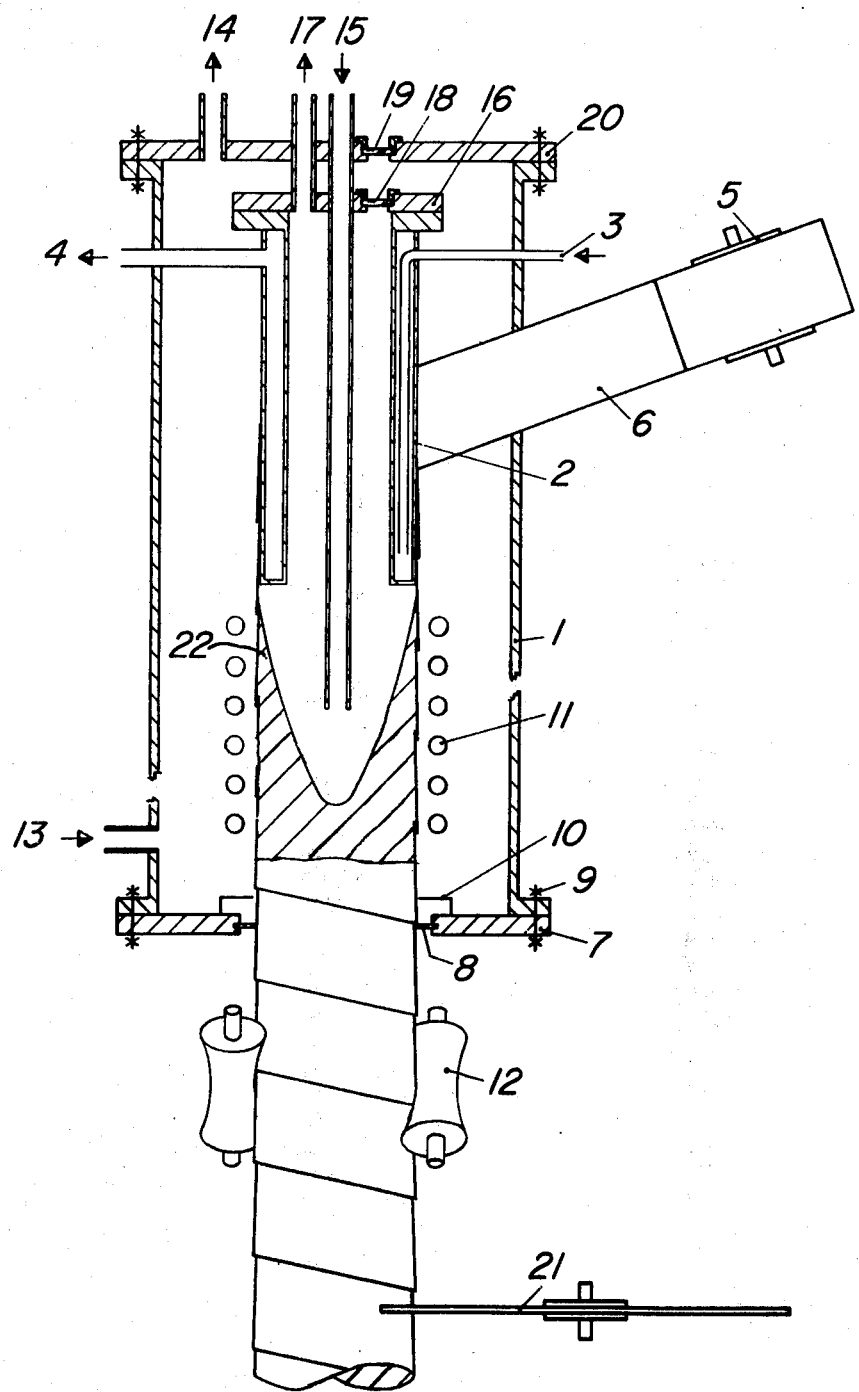

PROCESS FOR THE CONTINUOUS PRODUCTION OF SILICON RODS OR TUBES BY GASEOUS DEPOSITION INTO A FLEXIBLE WOUND BAND

The present invention relates to a process for the continuous production of silicon rods or tubes by the deposition of silicon from the gaseous phase onto the inner wall of a carrier tube heated to the deposition temperature.

Silicon is normally obtained by deposition from its readily volatile compounds onto one or several thin rods, for example of graphite, tantalum or, especially, silicon. If thin rods of silicon are used as carriers, they have to be zone-drawn from polycrystalline silicon rods. For the deposition process, the thin rods that are obtained are connected to an electrical energy source in a bell jar normally made of quartz. It is normal for the two rods in each case to be connected by a bridge and heated to the decomposition temperature of the gaseous silicon compound. If, for example, trichlorosilane in admixture with hydrogen and, optionally, other carrier gases, is introduced, elemental silicon is deposited on the thin rods heated to about 1,100° to 1,200° C. During the process, the quantity of silicon deposited per unit of time is at first small, but increases as the deposit on the carrier gradually thickens and as the deposit surface thus increases and, in the final phase, reached a quantity many times that of the initial quantity.

In order to achieve a high deposition rate from the start, according to a process described in German Offenlegungsschrift 21 60 670, silicon is deposited from the gaseous phase in a silicon tube heated to deposition temperature, until the inside of the tube has completely grown together. However, silicon tubes of the type used in this process for carriers could hitherto be manufactured only by complicated and expensive processes such as, for example, by depositing silicon onto carbon carriers that as a rule can be used only once, so that compared with the process described earlier, this process does not have any apparent advantage. In addition, this process is discontinuous, which means that with one batch, only comparatively small quantities of polycrystalline silicon can be produced.

It is therefore the object of the invention to find a process which allows the continuous production of polycrystalline silicon rods or tubes by deposition from the gaseous phase in large quantities.

In accordance with the invention, the object is accomplished in the following manner: Onto a cooled, hollow, metal cylinder arranged in a reactor and open at one end, which cylinder is provided with a gas feed and discharge pipe, a flexible hand made of a material substantially resistant to silicon at the deposition temperature is continuously wound in an overlapping manner and at an angle of pitch of from 5° to 40°, so as to form a tube; this tube is continuously removed from the hollow, metal cylinder by a rotary traction movement, and, in the portion thereof adjacent to the metal cylinder and still in the reactor, is heated by suitable heating means to a deposition temperature of about 1,050° to 1,250° C. While this heating proceeds, the carrier tube is gradually filled with silicon completely or partially, relative to the cross-section of the carrier tube. The deposition of silicon is brought about by decomposition of a suitable gaseous mixture under a pressure exceeding the external atmospheric pressure by 0.01 to 1 bar, and the deposited silicon is continuously removed from the reactor by a suitable drive means through the open end of the reactor.

With reference to the accompanying schematic drawing, the invention will now be described in more detail:

A hollow, metal cylinder 2 made of, for example, silver or silver-plated steel, is arranged in a reactor 1. Advantageously, the length of this hollow, metal cylinder corresponds approximately to between two and seven times its external diameter. The cylinder casing of this hollow, metal cylinder 2 is hollow inside, and, while the process is being carried out, a suitable cooling agent, for example, water, is made to flow through it via the admission pipe 3 and outlet pipe 4, in order to prevent silicon being deposited on its inner wall.

Inside or, preferably, outside the reactor 1 a reel 5 is arranged on which a flexible band 6 is coiled. This band is made of a material which at the deposition temperature of about 1,050° to 1,250° C is substantially resistant to silicon, for example, a material such as compressed quartz wool or, in particular, graphite film.

Graphite films of this type are commercially available and are produced, according to the manufacturer's information, from pure, high-quality graphite, the distances between the planes in the crystal lattice of the graphite being extended to many times the normal value of 3.35 A by means of chemical and thermal treatment. The resulting low bulk density of vermicular components is then compressed on calenders or presses to form the end product, the layers of the graphite lattice and the individual particles of the bulk material being joined firmly together again simply by the application of mechanical pressure.

The band 6 preferably made of graphite film is advantageously used in thicknesses of about 0.1 to 2 mm, preferably 0.5 to 1 mm, and in a width corresponding to approximately 0.25 to 2.5, and preferably 0.5 to 1.5 times the external diameter of the hollow metal cylinder 2.

At the start of the process, the band 6 is introduced into the reactor from the reel 5, preferably arranged outside the reactor, through a slot sealed with a normal lip seal, and is wound helically at an angle of pitch of from 5 to 40°, preferably 25° to 35°, and in an overlapping manner around the hollow metal cylinder 2 to form a graphite tube. At the start of the process, a hollow graphite cylinder 22, the external diameter of which corresponds to the external diameter of the hollow metal cylinder 2, and one end of which is sealed in a gas-tight manner by a graphite cover, is advantageously attached at its open end to the hollow metal cylinder, and the graphite band is continuously wound further from the hollow metal cylinder 2, at the same angle of pitch and in an overlapping manner, onto the hollow graphite cylinder 22, and, for example, is cemented at its lower end to said cylinder. For this process, the hollow graphite cylinder must be of a length such that, after it is attached to the hollow metal cylinder 2 and is wound round by the graphite band, it projects from the reactor.

Then, a lower cover plate 7 which has a circular opening provided with a lip seal 8, is pulled over the graphite tube and joined to the reactor 1 by means of the bolted joint 9, so as to be gas-tight. Suitable sealing materials are, for example, polytetrafluoroethylene or silicone. The seal 8 is advantageously protected against the heat produced by a heating device 11 by means of a thermal shield 10 made, for example, of stainless steel.

In the next stage, when the apparatus is being started up, the drive means is connected, which means serves to continuously draw the carrier tube, after it has been filled completely or partially with silicon, by means of a rotary traction movement out of the reactor 1. The simplest drive means consists of a set of steel rollers 12 which are inclined relative to the central axis of the hollow metal cylinder 2 advantageously within the range of from 5° to 40°, and preferably 25° to 35°, and are driven by an electric motor.

Before the actual deposition begins, the reactor is charged with a protective gas, for example, argon, via a gas feed pipe 13, and the air contained in the reactor is expelled via a gas discharge pipe 14. The selection of the protective gas is not important since it does not come into contact with the actual reaction area. The function of the protective gas is to prevent rapid oxidation of the graphite film heated by the heating device 11 to deposition temperature. On the other hand, a pressure is established in the reactor 1 by the protective gas, which corresponds approximately to the pressure in the deposition zone inside the continuously formed carrier tube.

During the actual deposition, the deposition gas is introduced under an excess pressure of about 0.01 to 1 bar, preferably 0.05 to 0.2 bar relative to the external atmospheric pressure, through a gas inlet pipe 15 which leads through a cover plate 16 into the inside of the hollow, metal cylinder 2, and projects from this, preferably by a length corresponding to 0.5 to 1.5 times the external diameter of the hollow metal cylinder 2, into the deposition tube wound from the flexible band 6 or, at the start of the process, into the corresponding hollow graphite cylinder. Residual or reaction gases are drawn off again through a discharge pipe 17.

In principle, we may use deposition gas, for example, silicon hydride, dichlorosilane, trichlorosilane or tetrachlorosilane, normally in admixture with hydrogen, a trichlorosilane-hydrogen mixture being preferred.

From the deposition gas, a layer of silicon, continuously growing inward, is deposited onto the inner wall of the graphite tube heated by the heating device 11 to a deposition temperature of about 1,050° to 1,250° C, preferably 1,120° to 1,180° C. In the process, the draw-off speed component is a determining factor in whether a solid body or a tube is produced. If tubes are to be manufactured, the speed component in the direction of delivery is the greater, the thinner the wall thickness of the silicon tube to be produced. By means of inspection glasses 18 and 19, made of quartz glass, arranged one above the other in a cover plate 16 of the hollow metal cylinder 2 and in a cover plate 20 of the reactor 1, it is possible for the deposition process to be observed, and accordingly, for the speed of the drive rollers 12 to be altered as necessary.

For the heating means 11, a simple resistance heating means may be used, such as cooled induction coil made of, for example, silver, or also a radiant heater in the form of a quartz coil having an appropriately hot tungsten core, surrounding the graphite carrier in the reactor at the connection to the hollow metal cylinder 2.

The process is preferably used for the production of silicon rods. The silicon rod emerging through the lower cover plate 7 of the reactor 1 and having passed drive rollers 12 is cut off according to the desired length, for example, with a diamond saw 21. For the production of tubes, a closure means must be attached to the reactor, since when the tube is cut off, the reaction area is cut open. The inclusion of a closure means can, however, be avoided if, depending on the desired length of the tube, the rotary traction movement is in each case stopped, before sawing off, until the tube has closed up in the deposition zone, and thus resealed the reaction area. These portions that have grown together are later sawn off from the tube portions and may be used, for example, as the starting material for the crucible-drawing process for the production of monocrystalline silicon.

The carrier tube, preferably of graphite foil, can be removed from the deposited silicon rod or tube by etching, burning off or simply by sandblasting.

In the preferred method of production of solid material, which may be used, for example, as the starting material in the crucible-drawing method according to Czochralski, or in crucible-free zone-drawing it is possible for a desired doping to be effected during the deposition process by the simple admixture of volatile doping compounds to the deposition gas. The quasi joint continuous production, according to the invention, of deposited silicon bodies and of the carrier continuously winding of its own accord by means of the rotary traction movement, does not even have to be interrupted when, in the case of the supply reel 5 arranged outside the reactor the band 6 has to be completely wound off, since as a rule the band enters so slowly that it is possible for a new reel of band to be inserted in the meantime without any problem, and for the end of the band of the old reel to be sewn, by means of a carbon filament, or simply glued, to the start of the band of the new reel.

Advantageously, the reactor 1 is so designed that it is possible to interchange hollow metal cylinders 2 of different diameter, according to the desired thickness of the rods or tubes to be made. The cover plate 7 is provided with a set of metal rings that nest one inside the other, with which the circular opening for the passage of the silicon rod or tube can be adapted to the particular rod or tube diameter.

In the following, the process of the invention will be more fully described in a specific example, but it should be understood, that this is given by way of illustration and not of limitation.

EXAMPLE

In the embodiment of the process according to the invention described below, the reactor has a diameter of 50 cm and a height of 75 cm, and consists of a stainless chromium-nickel-steel alloy. A band of graphite film of a thickness of 0.75 mm and a width of 250 mm is continuously pulled inside, at an angle of pitch of 30° onto the water-cooled hollow metal cylinder made of silver-plated steel and having an external diameter of 15 cm and a length of 45 cm, from a reel arranged outside the reactor through a slot in the reactor wall and sealed by a lip seal of polytetrafluoroethylene.

A gaseous mixture, consisting of 80% hydrogen and 20% trichlorosilane, is introduced, at a pressure exceeding the external atmospheric pressure by 0.1 bar, via a silver gas inlet pipe, which projects 10 cm out of the hollow metal cylinder into the graphite carrier tube, which mixture continuously deposits onto the carrier tube heated by means of a resistance heater to 1,150° C. The reactor is filled with argon at a pressure exceeding external atmospheric pressure likewise, by 0.1 bar. A silicon rod of 15 cm thickness is growing within the carrier tube and drawn out of the reactor, at a length of about 20 mm per hour for a little less than 1/10 of a revolution per hour about the longitudinal axis.

The carrier tube is then removed by etching, burning or sandblasting.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for the continuous production of silicon rods or tubes by the deposition of silicon from a gaseous mixture on the inner wall of a carrier tube heated to the deposition temperature, which comprises the steps of
    a. cooling a hollow metal cylinder having one open end in a reactor;
    b. continuously winding around the hollow metal cylinder a flexible band substantially resistant to silicon at the deposition temperature, in an overlapping manner and at an angle of pitch from 5° to 40°, so as to form a carrier tube for the silicon to be deposited;
    c. continuously drawing the tube off the metal cylinder by a rotary traction movement and heating the portion of the tube adjacent the metal cylinder and still in the reactor to the deposition temperature of about 1,050° to 1,250° C;
    d. at the same time passing said gas mixture for decomposition through the tube under a pressure exceeding the external atmospheric pressure by 0.01 to 1 bar, thus causing the inside of the tube gradually to be filled at least partly with silicon as the decomposition of the gas mixture proceeds; and
    e. continuously withdrawing the Si-filled tube from the reactor at the open end thereof and obtaining the silicon rod or tube by the removal of the carrier tube.

2. The process according to claim 1, wherein the carrier tube is completely filled by the deposition of silicon.

3. The process according to claim 1, wherein the gas mixture is fed through a pipe, centrally into the hollow metal cylinder, said pipe projecting from the open end of the metal cylinder, by a length corresponding to 0.5 to 1.5 times the diameter of the hollow, metal cylinder, into the heated portion of the carrier tube.

4. The process according to claim 1, wherein the flexible band from which the carrier tube is wound, is made of graphite film.

5. The process according to claim 1, wherein the band from which the carrier tube is wound, has a width corresponding to 0.5 to 1.5 times the external diameter of the hollow metal cylinder.

6. The process according to claim 1, wherein the band is wound at an angle of pitch of from 25° to 35°.

7. The process according to claim 1, wherein the silicon is deposited from a trichlorosilane-hydrogen mixture.

8. The process according to claim 1, wherein the gaseous mixture from which silicon is deposited, is introduced into the hollow metal cylinder at a pressure exceeding that of the external atmospheric pressure by 0.05 to 0.2 bar.

9. The process according to claim 1, wherein the reactor is made of stainless steel.

* * * * *